United States Patent
Dedic et al.

(10) Patent No.: US 12,184,301 B1
(45) Date of Patent: Dec. 31, 2024

(54) CHARGE TO VOLTAGE CONVERTER

(71) Applicant: Acacia Communications, Inc., Maynard, MA (US)

(72) Inventors: Ian Dedic, London (GB); Gavin Allen, Greenwood (AU); Ramesh K. Singh, Maynard, MA (US)

(73) Assignee: ACACIA COMMUNICATIONS, INC., Maynard, MA (US)

( * ) Notice: Subject to any disclaimer, the term of this patent is extended or adjusted under 35 U.S.C. 154(b) by 0 days.

(21) Appl. No.: 17/373,884

(22) Filed: Jul. 13, 2021

Related U.S. Application Data

(63) Continuation of application No. 16/836,267, filed on Mar. 31, 2020, now abandoned.

(60) Provisional application No. 62/979,137, filed on Feb. 20, 2020.

(51) Int. Cl.
| | |
|---|---|
| *H03M 1/46* | (2006.01) |
| *H02M 3/337* | (2006.01) |
| *H03F 3/30* | (2006.01) |
| *H03M 1/12* | (2006.01) |
| *H04B 1/16* | (2006.01) |

(52) U.S. Cl.
CPC ......... *H03M 1/466* (2013.01); *H02M 3/3376* (2013.01); *H03F 3/3096* (2013.01); *H03M 1/1245* (2013.01); *H03M 1/462* (2013.01); *H04B 1/16* (2013.01)

(58) Field of Classification Search
CPC ..... H03M 1/466; H03M 1/1245; H03M 1/462
See application file for complete search history.

(56) References Cited

U.S. PATENT DOCUMENTS

| | | | | | |
|---|---|---|---|---|---|
| 3,248,693 | A | * | 4/1966 | Farkas | H04L 1/00 341/94 |
| 4,270,120 | A | * | 5/1981 | Prill | G05D 3/12 318/656 |
| 5,699,064 | A | * | 12/1997 | Sakiyama | H03M 3/376 341/154 |
| 7,411,538 | B1 | * | 8/2008 | Piasecki | H03M 1/0607 341/161 |
| 9,748,949 | B1 | * | 8/2017 | Lu | H01L 27/0605 |
| 11,050,386 | B2 | * | 6/2021 | Wang | H03F 3/45179 |
| 2002/0036583 | A1 | * | 3/2002 | Enriquez | H03F 3/3066 341/162 |
| 2004/0160266 | A1 | * | 8/2004 | Coutu | H03K 17/6872 327/427 |
| 2008/0061830 | A1 | * | 3/2008 | Lee | H03K 19/018521 326/83 |
| 2013/0271305 | A1 | * | 10/2013 | Kim | H03M 1/0863 341/154 |
| 2017/0255250 | A1 | * | 9/2017 | Ngo | G06F 13/4282 |
| 2019/0296756 | A1 | * | 9/2019 | Ali | H03F 1/301 |
| 2020/0274546 | A1 | * | 8/2020 | Kim | H03M 1/466 |

* cited by examiner

*Primary Examiner* — Lam T Mai
(74) *Attorney, Agent, or Firm* — K&L Gates LLP

(57) ABSTRACT

An apparatus, method, and system for converting a charge to a voltage.

20 Claims, 2 Drawing Sheets

CHARGE TO VOLTAGE CONVERTER

CROSS REFERENCE TO RELATED APPLICATIONS

This application is a continuation of U.S. patent application Ser. No. 16/836,267 filed Mar. 31, 2020 entitled "Charge to Voltage Converter," which claims the benefit of U.S. Provisional Patent Application Ser. No. 62/979,137 filed Feb. 20, 2020 entitled "Charge to Voltage Converter," which is hereby incorporated herein by reference in its entirety for all purposes. This application is related to U.S. Provisional Patent Application Ser. No. 62/950,612 filed Dec. 19, 2019 entitled "High-Q Clock Buffer"; U.S. Patent Application Ser. No. 62/879,095 filed Jul. 26, 2019 entitled "Switch;" U.S. patent application Ser. No. 16/564,044 filed Sep. 9, 2019 entitled "High-Q Switch Inductor;" U.S. patent application Ser. No. 16/587,191 filed Sep. 30, 2019 entitled "Distributed Voltage Controlled Oscillator (VCO);" and U.S. patent application Ser. No. 16/685,063 filed Nov. 15, 2019 entitled "Clock Buffer Inductor;" all of which are hereby incorporated by reference in their entirety for all purposes.

BACKGROUND

A clock may be used to provide a timing signal in a digital circuit.

BRIEF DESCRIPTION OF THE FIGURES

Various aspects and embodiments of the application will be described with reference to the following example embodiments. It should be appreciated that the figures are not necessarily drawn to scale.

SUMMARY

Figure 1:
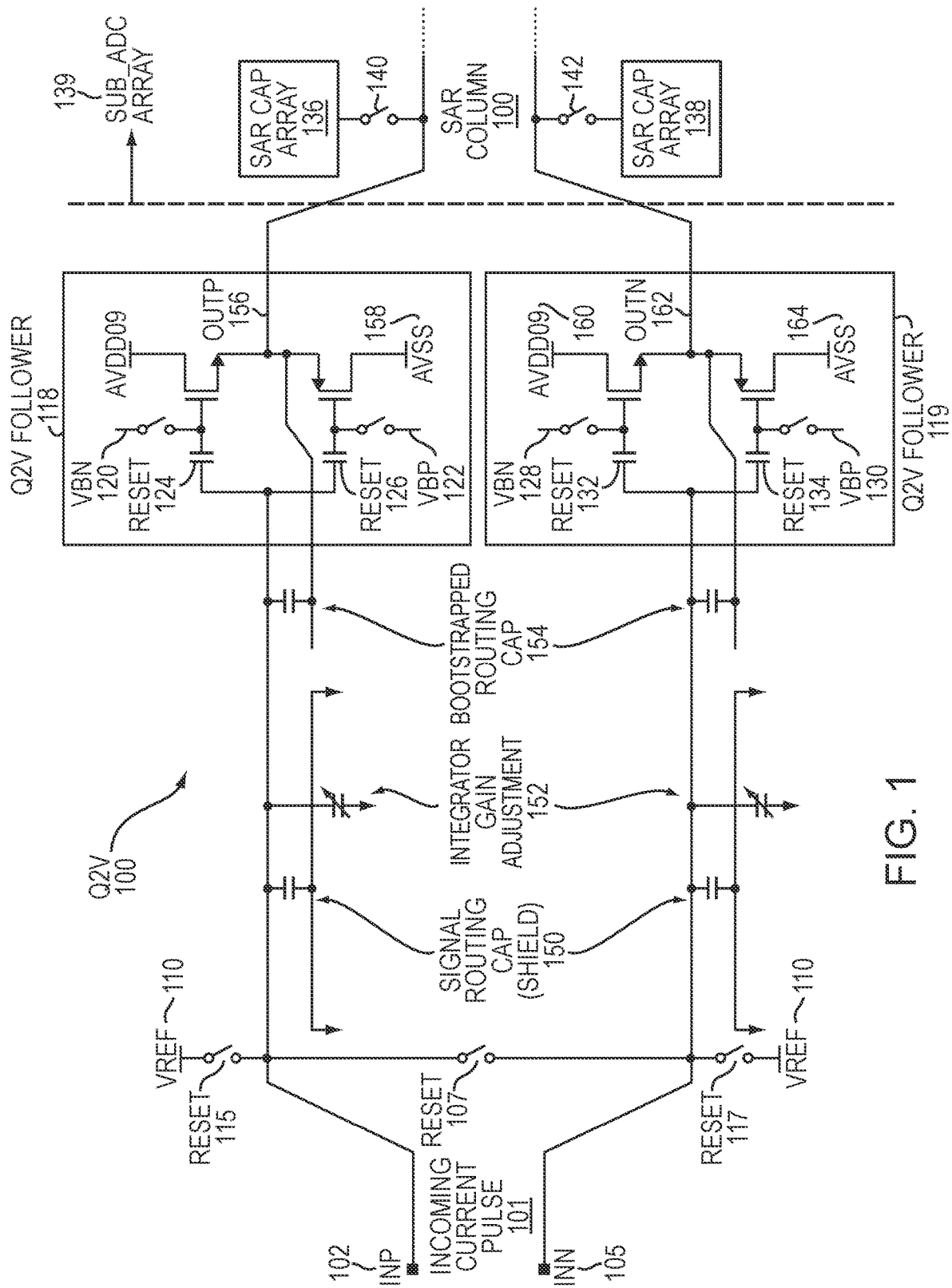
FIG. 1 is a simplified illustration of a charge to voltage converter, in accordance with an embodiment of the present disclosure.

An apparatus, method, and system for converting a charge to a voltage.

DETAILED DESCRIPTION

In many embodiments, a communication or transmission system may include a transmitter and a receiver. In some embodiments, a communication system may include two transceivers. In most embodiments, a transmission, such as a set of bits, may be encoded in a signal at a transmitter. In most embodiments, a transmitter may transmit an encoded signal to a receiver. In certain embodiments, a receiver may receive a signal from a transmitter and decode the signal into information. In almost all embodiments, there may be a number of conditions that may impact the signal which may make it hard to decode the information. In certain embodiments, a signal may be transmitted over an RF connection. In other embodiments, a signal may be transmitted over an optical link.

In some embodiments, in a coherent optical system, a digital electrical signal may be received. In certain embodiments, a digital electrical signal may be converted to an analog signal. In many embodiments, an analog signal may be converted to an optical signal. In almost all embodiments, a received optical signal may need to be converted to an analog signal, which may need to be converted to an electrical signal or digital signal.

In most embodiments, a coherent optical communication system may have high data rates. In almost all embodiments, it may be necessary to divide data received into discrete time intervals. In many embodiments, a clock on a transmitter may determine when a signal is sent out. In some embodiments, an analog to digital converter may determine when samples are taken and converted into a digital format. In many embodiments, in a coherent optical system, it may be necessary to do a conversion between a digital signal and an analog signal at many gigabaud per second. In most embodiments, in a coherent optical signal, it may be necessary to convert an optical signal to an analog signal at many gigabaud per second. In some embodiments, in a coherent optical system, it may be necessary to convert an analog signal to an electrical signal at many gigabaud per second.

In most embodiments in a coherent optical system, a conversion between digital to analog, analog to optical, optical to analog, and analog to digital may need to run at speeds of 50-60 gigabaud or faster per second. In many embodiments, accuracy of a conversion may need to be high and signal to noise distortion of the signal may need to be low. In almost all embodiments, accurate conversion of a signal may require an accurate clock at both a transmission site and at a receive site. In most embodiments, a clock may need to run at a high speed and have very high slew rates. In certain embodiments, slew rate may be 2 pi times the frequency of the clock. In many embodiments, if a clock moves in time, such as jittering backward or forward in time, this may introduce a time error into a communication system which may then introduce a voltage error which may degrade the accuracy of a communication. In some embodiments herein, jitter may refer to phase noise (i.e. random, undesired fluctuations) in the wave produced by a voltage-controlled oscillator (VCO).

In many embodiments, there may be 20 picoseconds between transmitted or received data samples. In certain embodiments, a clock may be used to denote the time between samples. In some embodiments, a same amount of jitter may create bigger voltage errors at higher frequencies. In most embodiments, a clock may need to be distributed to each circuit or device that uses the clock. In many embodiments, a distribution of a clock may need to cover a big area. In certain embodiments, distributing a clock of a VCO across a distance may take power. In almost all embodiments, it may be beneficial to be able to generate and distribute a clock signal without dissipating power and keeping jitter to a minimum.

In almost all embodiments, it may be beneficial to convert an analog signal, such as an optical or wireless signal, into a digital signal. In most embodiments, an analog signal may contain many samples per time period. In certain embodiments, an analog signal may contain too many samples per time period to directly convert the analog signal into a digital signal.

In many embodiments, it may also be necessary to demultiplex a received signal to enable demuxed signals to be converted from analog signals to a digital signals in parallel. In most embodiments, it may be beneficial to have a low-power high-performance front-end for a high-speed (tens of gigasamples) analog to digital converter. In almost all embodiments, it may be beneficial to be able to demultiplex a sampled signal to drive an array of lower-speed interleaved ADCs. In most embodiments, it may not be possible to convert a signal with tens of gigasamples at once and it may be necessary to split a signal sample into multiple parallel number of samples. In certain embodiments, a received analog signal may be expressed as one or more currents or current packets as a carrier for the signal.

In some embodiments, it may be difficult to cascade multiple stages of demultiplexing of a signal using current as a carrier without loss, to accurately synchronize all clocks across a demultiplexed signal (e.g., ensure that each demuxed signal is at the same clock cycle as each other signal), and to match a signal transfer bandwidth/gain to all the sub-ADCs, corresponding to pieces of the demultiplexed signal. In many embodiments, when charges are transmitted and demultiplexed, conversion from a current or current packet to a voltage may take place on an ADC input capacitor before the signal is converted to a digital signal.

In some embodiments, a signal may be received and converted to a number of interleaved charges. Typically, an input signal may be divided up into interleaved charge "packets" (current pulses). Conventionally, current pulses may be demultiplexed in multiple cascaded stages all through to a large array (e.g., 256) of sub-ADCs. Generally, a large array of sub-ADCs may convert charges to voltage on the ADC input capacitor. Usually, if information is kept as a set of charges, then conversion from analog to digital occurs after the charges are demuxed all the way and the charges reach a final A2D array.

In many embodiments, Applicants have realized that with transmission of charges, it may be necessary to track capacitance and resistance in a distribution network or demultiplexing network. In certain embodiments, a charge distribution network or demultiplexing system may tend to be long and it may be difficult to accurately transfer high-speed current pulses without loss, especially in long tracks needed to connect the sub-ADCs together. In some embodiments, to demux a signal with multiple charge packets may require a track for each bit of information per time slice, which may require a large array of A2D converters and long tracks to carry each charge to each individual A2D.

In almost all embodiments, to demux a data in a signal being carried by charges may require that the charges be distributed across a set of narrow wires or narrow transmission paths, where the transmission paths need to be kept close to each other because of space requirements. In some embodiments, it may be difficult to keep a constant clock across a series of closely spaced transmission paths carrying charges. In most embodiments, resistance may go up the longer a transmission line is for a charge, making it harder to drive the charge across the transmission line. In many embodiments, Applicants have realized that insufficient settling time on a distribution network may lead to sample-to-sample leakage (ISI). In certain embodiments, Applicants have realized that ISI may cause periodic ripples in a frequency response of an ADC output which may be difficult to remove.

In many embodiments, Applicants have realized that it may be beneficial to covert a current pulse into voltage and transmit the voltage instead of the current pulse. In some embodiments, short current pulses (charge packets) may be converted into to multiple parallel interleaved sample-and-held voltages. In most embodiments, conversion from a current to a voltage may occur after a first demultiplexing stage, where the first stage may split a received charge signal into a number of parallel packet signals or charges, for example 16. In almost all embodiments, conversion from a current to a voltage may occur before a long-distance final interconnect and demultiplexing stages to sub-ADCs, which may convert a signal from analog to digital. In many embodiments, conversion of a charge to a voltage may be beneficial as the voltage may move slower than a charge. In most embodiments, a voltage may be a slow stepped signal compared to a narrow pulse charge. In a particular embodiment, a charge may be 10 mA by 20 pico seconds where a voltage may be much wider and easier to control.

In most embodiments, voltages may be buffered to drive groups of sub-ADCs (e.g., 16 per buffer) via more multiplexing stages. In many embodiments, as voltage drives may be low impedance and much slower than short current pulses, it may be easier to distribute and demultiplex voltages without losses in an interconnect, and clock synchronization may also be easier. In many embodiments herein, a circuit that takes in short current pulses (charge packets), converts them to slower voltages, and drives the voltages into multiplexed ADC loads, may be referred to as a charge-to-voltage (Q2V) converter.

In many embodiments, a Q2V circuit may be used within an ADC to convert short sampled current pulses into a voltage. In certain embodiments, an ADC may initially divide an input signal up into interleaved charge "packets" (current pulses), which are demultiplexed in multiple cascaded stages through to a large array (e.g., 256) of sub-ADCs. In some embodiments, a Q2V may interface between demultiplexer stages and a sub-ADC array. In certain embodiments, a Q2V may integrate a sampled charge and may drive an integrated voltage down a successive-approximation-register (SAR) column where it is connected to SAR input caps. In many embodiments, further demultiplexing may be carried out down a SAR column. In some embodiments, a SAR may be constructed from an array of capacitors. In certain embodiments, input voltage may be sampled by a SAR before it is converted to a digital value.

In most embodiments, a Q2V offers a benefit over using current pulses. In many embodiments, if a carrier pulse has a high sample rate, then there may be a narrow charge pulse for each sample. In certain embodiments, a narrow charge pulse may mean that there is little charge available for each sample. In some embodiments, a narrow pulse may require a small capacitor to convert the pulse, which may result in problems with mismatch. In many embodiments, with a Q2V, if a conversion is made to voltage before a current pulse is fully demuxed, then more charge may be available to drive a capacitor. In many embodiments, a Q2V with a push pull source follower may be efficient as the push pull source follower is an efficient circuit.

In some embodiments, a Q2V may function in 2 phases—a reset phase and a sample phase. In certain embodiments, in a reset phase inputs (INP, INN) may be reset to a known starting voltage (VREF). In certain embodiments, INP and INN may signify a differential signal. In many embodiments, bias nodes of a Q2V follower (VBN, VBP) may be shorted to input ac-couplers. In certain embodiments, bias nodes may mean nodes where a bias voltage may define internal voltages or currents in a circuit. In certain embodiments, AC coupling capacitors may be used when a DC voltage of an input signal is different than a DC voltage of circuits driven by the DC voltage. In some embodiments, bias nodes VBN, VBP may be biased to provide sufficient quiescent current for speed requirements and to set a reset output to a required starting voltage. In certain embodiments, in a reset phase, SAR input caps (of a chosen SAR sub-ADC) may be connected to follower outputs to correctly set starting conditions.

In some embodiments, a Q2V may have a signal routing cap (shield), which may provide parasitic capacitance of a signal track, which may be a grounded shield used to prevent noise coupling. In most embodiments, a Q2V may have a SAR column or a SAR row, depending on layout direction, which may refer to a set of SAR ADCs. In many embodiments, each of a set of SAR ADCs may connect to one Q2V output. In some embodiments, SAR ADCs may be time-interleaved to convert Q2V analog out output to digital. In most embodiments, a Q2V may have a bootstrapped routing cap to reduce an effective size of a routing capacitance by driving a shield from an output of a buffer.

In many embodiments, in a sample phase, reset switches may be opened to be ready for arrival of signal current pulses. In most embodiments, current pulses may be integrated onto an integrating capacitor. In many embodiments, an integrating capacitor may change or convert a current or charge into a voltage. In almost all embodiments, voltage may be equal to current times time divided by charge. In some embodiments, an integrating capacitor may be part of a push-pull source follower. In certain embodiments, a pulse charge may charge capacitors of a push-pull source follower. In most embodiments, charging of capacitors of a push-pull source follower may lead to a voltage on the push pull source follower. In many embodiments, a voltage of a push pull source follower may be buffered by the push-pull source follower. In most embodiments, a voltage buffered by a push-pull source follow may drive a transmission line to an ADC. In many embodiments, a Q2V may be able to adjust gain by changing the amount of capacitance. In some embodiments, analog switches may be used to add or subtract trimming capacitors to change the capacitance. In certain embodiments, by switching in or out capacitance in a Q2V it may be possible to trim out gain mismatches. In some embodiments, there may be various causes of gain mismatch between circuits in the overall ADC including circuits before the Q2V, such as with a sampler/demux, the Q2V itself, or after the Q2V, such as in the SAR. In certain embodiments, adjusting capacitance of a Q2V may be a simple and low-power way to adjust the gain to remove mismatches.

In some embodiments, for a Q2V integrating capacitor, integration may be a combination of follower input capacitance, signal routing capacitance (dominant cap) and some small switched capacitance, which is used for gain/offset calibration. In certain embodiments, signal routing capacitance may be the biggest component of overall capacitance, depending on signal routing distance. In some embodiments, switched capacitance to trim gains may be a small fraction of the overall capacitance, typically less than 10%. In most embodiments, analogue switches may be used to connect and disconnect trimming capacitors. In many embodiments, bootstrapping a proportion of a signal routing from a follower output may be used to set a full-scale voltage swing. In many embodiments, SAR input caps may be disconnected—after the signal has settled but before the next reset phase.

In many embodiments, a current solution may mitigate charge loss/leakage as routing is used as an nfollower output as a voltage. In some embodiments, the current disclosure may disconnect SAR cap array size from sampled charge magnitude. Typically, with charge packets, a SAR cap array size may have been set for a certain full-scale swing (q=CV). In most embodiments, a SAR cap array size may be minimized for the required number of bits (mismatch requirements). In some embodiments, if a SAR capacitor array is made small to minimize area and power and maximize voltage (because V=Q/C) then there may be a mismatch between the capacitors in the SAR array, which may be too big to give a required ADC linearity. In certain embodiments, as an integrated voltage may be ac-coupled onto the follower input, the DC level of the input of the follower (output of demultiplexers) may be decoupled from a required input swing to a SAR comparator. In many embodiments, inside a SAR ADC may be a comparator which performs comparison required by a successive approximation algorithm and this comparator may require a given DC input voltage for correct functioning. In most embodiments, a DC input voltage for a comparator may be different from a DC voltage required at a DEMUX output (Q2V input) for correct functioning. In almost all embodiments, AC couplers allow a DC input voltage for a comparator to be different than a DC voltage for a DEMUX output. In some embodiments, follower biasing (VBN, VBP) may be set to a required level.

Refer now to the example embodiment of FIG. 1 which illustrates a charge to voltage converter. Inputs INP 102 and INN 105 are reset to known starting voltage VREF 110 using reset switches 107, 115, and 117. Bias nodes VBN 120 VBP 122 of Q2V follower 118 are shorted to the input ac-couplers. Bias nodes VBN 128 VBP 130 of Q2V follower 119 are shorted to the input ac-couplers. Bias VBN 120, 128, and VBP 122, 130 are biased to provide sufficient quiescent current for speed requirements, and to set the reset output to the required starting voltage. During this phase, SAR input caps 136 and 138 (of SAR sub-ADC 139) are also connected to the follower outputs to correctly set the starting conditions. Signal routing cap (shield) 150 is parasitic capacitance of the signal track, typically a grounded shield is used to prevent noise coupling into sensitive nodes 102, 105, 124, and 132. Nodes 102, 105, 124, and 132 are sensitive to noise pick up as a charge coupled in through a parasitic capacitor may be added to their stored charge Q. SAR column 100 refers to a set of SAR ADCs, where each of the SAR ADCs connect to one Q2V output. In these embodiments, the SAR ADCs are time-interleaved to convert the Q2V output to digital, Bootstrapped routing cap 154 reduces an effective size of the routing capacitance by driving shield 150 from the output of the buffer. In a particular embodiment, if a buffer gain was 0.8×, then the effective capacitance may be reduced by 5× because of the voltage across it is reduced from Vin to 0.2 Vin (since Vout-0.8Vin).

Refer back to the example embodiment of FIG. 1. Reset switches 107, 115, 117, 126, and 134 are opened ready for the arrival of signal current pulses 100. In integrate mode, current pulses arrive. Incoming current pulses 100 are integrated onto the integrating capacitor 152. For the Q2V integrating capacitor, this is combination of follower input capacitance, signal routing capacitance (dominant cap) and some small switched capacitance which is used for gain/offset calibration. Bootstrapping a proportion of the signal routing from the follower output is used to correctly set full-scale voltage swing. Integrating capacitor 152 drives SAR capacitors 136, 138. In convert phase, SAR input cap 136, 138 are then disconnected—after the signal has settled but before the next reset phase. Sar conversion proceeds to convert the signal.

Figure 2:
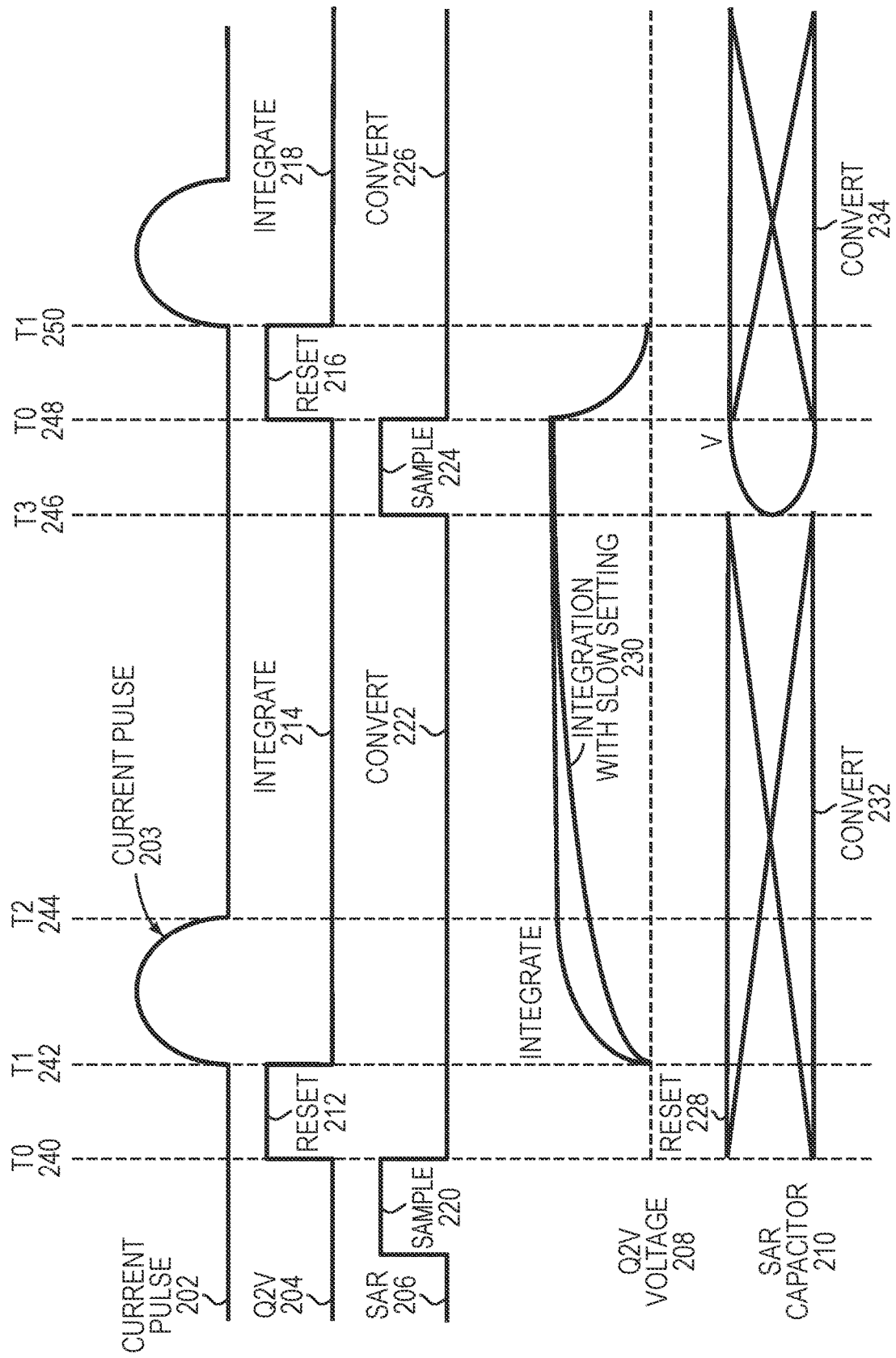
FIG. 2 is a simplified illustration of a timing diagram for a charge to voltage converter, in accordance with an embodiment of the present disclosure.

Refer now to the example embodiment of FIG. 2, which illustrates a timing diagram for a Q2V converter. Current pulse track 202 indicates over time, when a current pulse arrives. Q2V track 204 indicates when Q2V is in reset mode 212 integration mode 214. SAR track 204 indicates when it is in sample 220 mode or convert mode 222. Q2V voltage track 208 indicates the voltage in the Q2V. SAR Capacitor 210 indicates what the SAR Capacitor is doing at a given time. T0 240 indicates that it is the end of SAR sampling and a start of Q2V reset. T1 242 indicates that it is the end of Q2V reset and the start of Q2V integrate window, which is the earliest time current pulse can begin to be received. T2 244 indicates the end of current pulse, where Q2V will not have settled yet, which is shown by "slow settling" line 230. T3 246 indicated SAR sampling begins and that Q2V is almost settled. T0 248 indicates the end of SAR sampling and Q2V must be settled by T0 248.

Refer now to the example embodiments of FIGS. 1 and 2. For accurate conversion of input charge to ADC:

A current pulse should arrive after end of Q2V reset period 212; in FIG. 2 the end of reset period is at time T1 242, and current pulse 203 occurs between T1 242 and T2 244 in current pulse track, which occurs after then end of reset 212; reset 212 starts at T0 240 and ends at T1 242 in track Q2V 204.

Pulses can arrive at any time in the integration period, which is between T1 242 and T0 248, but there needs to be an arrival "window" to allow for delay time differences between current pulse and Q2V clocks. The earlier that the current pulse arrives in this window, the more time is available for Q2V settling.

The arrival of pulse Q2V settling must be complete by end of SAR sampling period 220 at time T0 240. SAR capacitor 210 settling must be complete by end of SAR sampling period at time T0 240.

SAR capacitor 210 can start sampling any time before T0 240 during integration period. SAR 206 must disconnect from Q2V before Q2V reset begins.

Q2V voltage must be settled (reset complete) before start on next integration period, which starts at T1 242

ADC conversion must have completed before SAR goes back into sampling mode 224 at T3 246

In some embodiments, it may be preferable to obtain the maximum operating speed to ensure that a Q2V integration period is as long as possible to allow maximum time for circuit settling and biggest time window for current pulse arrival. In many embodiments it may be desirable that a Q2V reset be as short as possible while still resetting Q2V voltages. In other embodiments, it may be beneficial that a SAR conversion period be as long as possible to give highest ADC sampling rate. In many embodiments, a SAR capacitor sampling time may be as short as possible while still allowing SAR capacitor voltage to settle.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

What is claimed is:

1. A charge to voltage (Q2V) converter for converting a charge to a voltage, the Q2V converter comprising:
    a pair of push-pull source followers; and
    a set of alternating current (AC) coupling capacitors coupled to each of the push-pull source followers.

2. The Q2V converter of claim 1, further comprising:
    a set of reset switches; wherein the set of AC coupling capacitors includes a trimmable capacitor enabled to change a capacitance of the set of AC coupling capacitors.

3. The Q2V converter of claim 1, wherein the Q2V is connected to a set of successive-approximation-register (SAR) ADCs; wherein an output of the pair of push-pull source followers is used to drive the set of SAR ADCs.

4. The Q2V converter of claim 1, further comprising a set of bootstrapped shields and an input node; wherein the bootstrapped shields are driven by an output node and electrically coupled to the input node and reduce an effective input capacitance of the Q2V converter.

5. The Q2V converter of claim 4, further comprising:
    a set of bias nodes;
    a set of successive-approximation-register (SAR) input capacitors; and
    logic enabling:
closing of the set of reset switches to reset values in the Q2V converter;
    shorting bias nodes; and
    electrically connecting the set of SAR input capacitors to the Q2V converter.

6. The Q2V converter of claim 5, wherein the logic further comprises:
    opening the set of reset switches of the Q2V converter;
    integrating a current pulse into the Q2V converter; and
    disconnecting the set of SAR input capacitors of the Q2V converter.

7. The Q2V converter of claim 6, wherein the logic further comprises converting a received pulse into a voltage using the SAR input capacitors.

8. A method for converting a current pulse to a voltage, the method comprising:
   closing a set of reset switches of a charge to voltage (Q2V) converter to reset values in the Q2V converter; wherein the Q2V converter comprises a set of bias nodes; and
   shorting the set of bias nodes of the Q2V converter.

9. The method of claim 8, further comprising:
   connecting a set of successive-approximation-register (SAR) input capacitors of the Q2V converter;
   opening the set of reset switches of the Q2V converter;
   integrating a current pulse into the Q2V converter; and
   disconnecting the set of SAR input capacitors of the Q2V converter.

10. The method of claim 9, further comprising converting a received pulse into a voltage using the SAR input capacitors.

11. A system for converting charge to voltage, the system comprising:
   a charge to voltage (Q2V) converter; wherein the Q2V converter comprises a set of reset switches, a set of successive-approximation-register (SAR) input capacitors, and a set of bias nodes; and
   logic enabling the Q2V converter to:
   close the set of reset switches to reset values in the Q2V converter;
   short the set of bias nodes of the Q2V converter; and
   connect the set of SAR input capacitors of the Q2V converter.

12. The system of claim 11, wherein the logic further enables the Q2V converter to:
   open the set of reset switches of the Q2V converter;
   integrate a current pulse into the Q2V converter; and
   disconnect the set of SAR input capacitors of the Q2V converter.

13. The system of claim 12, wherein the logic further enables the Q2V converter to convert a received pulse into a voltage using the set of SAR input capacitors.

14. The system of claim 13, where the Q2V converter further comprises a pair of push-pull source followers and a set of alternating current (AC) coupling capacitors.

15. The system of claim 14, wherein each of the pair of push-pull source followers comprises a set of capacitors; wherein the set of capacitors includes a trimmable capacitor enabled to change the capacitance of the set of capacitors.

16. The system of claim 15, further comprising:
   a set of SAR analog-to-digital converters (ADCs); wherein the Q2V is connected to the set of SAR ADCs; wherein an output of the push-pull source followers is used to drive the set of ADCs.

17. The system of claim 16, wherein the Q2V converter further comprises a set of bootstrapped shields and an input node; wherein the bootstrapped shields are driven by an output node and electrically coupled to the input node and reduce an effective input capacitance of the Q2V converter.

18. A method for converting a current pulse to a voltage, the method comprising:
   closing a set of reset switches of a charge to voltage (Q2V) converter; wherein the Q2V converter comprises a set of bias nodes; and
   shorting the set of bias nodes of the Q2V converter.

19. The method of claim 18, further comprising connecting a set of successive-approximation-register (SAR) input capacitors of the Q2V converter.

20. The method of claim 19, further comprising:
   opening the set of reset switches of the Q2V converter; and
   integrating a current pulse into the Q2V converter.

* * * * *